United States Patent
Takahashi et al.

(10) Patent No.: US 10,320,226 B2
(45) Date of Patent: Jun. 11, 2019

(54) SOLAR PHOTOVOLTAIC GENERATION DEVICE

(71) Applicant: TOYOTA JIDOSHA KABUSHIKI KAISHA, Toyota-shi, Aichi-ken (JP)

(72) Inventors: Sayuri Takahashi, Gamagori (JP); Tatsuya Miyoshi, Nisshin (JP); Haruki Matsuoka, Kuwana (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 37 days.

(21) Appl. No.: 15/651,417

(22) Filed: Jul. 17, 2017

(65) Prior Publication Data

US 2018/0026474 A1    Jan. 25, 2018

(30) Foreign Application Priority Data

Jul. 19, 2016  (JP) .................. 2016-141360

(51) Int. Cl.
*H02J 7/00* (2006.01)
*H02J 7/35* (2006.01)
(Continued)

(52) U.S. Cl.
CPC ............. *H02J 7/35* (2013.01); *H01L 31/042* (2013.01); *H02J 7/007* (2013.01); *H02J 7/008* (2013.01);
(Continued)

(58) Field of Classification Search
CPC .. H02J 7/35; H02J 7/007; H02S 40/38; H02S 50/00
(Continued)

(56) References Cited

U.S. PATENT DOCUMENTS 9,787,170 B2 * 10/2017 Inoue et al. .............. G05F 1/67
2015/0001932 A1 * 1/2015 Inoue et al. .............. G05F 1/67
307/24
(Continued)

FOREIGN PATENT DOCUMENTS

JP    H05244731 A    9/1993
JP    2012-196022 A   10/2012
(Continued)

*Primary Examiner* — Sun J Lin
(74) *Attorney, Agent, or Firm* — Hunton Andrews Kurth LLP

(57) ABSTRACT

In a case where it is determined that a generated electric power of a solar panel is less than a predetermined value, a control unit of a solar photovoltaic generation device is configured to disconnect a solar battery from a first electric power conversion unit and a second electric power conversion unit, stop providing a power supply to the first electric power conversion unit to execute a power saving control, and store an open circuit voltage of the solar panel as a reference voltage after the execution of the power saving control. In a case where the open circuit voltage of the solar panel exceeds the reference voltage continuously for a predetermined time period after the execution of the power saving control, the control unit is configured to connect the solar battery to the first electric power conversion unit and the second electric power conversion unit, and start providing the power supply to the first electric power conversion unit to release the power saving control.

8 Claims, 8 Drawing Sheets

(51) Int. Cl.
  *H02S 40/38* (2014.01)
  *H02S 50/00* (2014.01)
  *H02S 50/10* (2014.01)
  *H01L 31/042* (2014.01)

(52) U.S. Cl.
  CPC .............. *H02S 40/38* (2014.12); *H02S 50/00* (2013.01); *H02S 50/10* (2014.12); *Y02E 10/566* (2013.01)

(58) Field of Classification Search
  USPC ........................................................ 320/101
  See application file for complete search history.

(56) References Cited

U.S. PATENT DOCUMENTS

| | | | |
|---|---|---|---|
| 2016/0056759 A1* | 2/2016 | Pinneo et al. .......... | H02S 40/38 307/23 |
| 2016/0134157 A1 | 5/2016 | Maeno et al. | |
| 2016/0299180 A1* | 10/2016 | Liao et al. ........... | G01R 22/063 |
| 2017/0093162 A1* | 3/2017 | Inoue ....................... | H02J 3/382 |

FOREIGN PATENT DOCUMENTS

| | | | |
|---|---|---|---|
| JP | 2014036563 A | 2/2014 |
| JP | 2014174876 A | 9/2014 |
| JP | 2014-217218 A | 11/2014 |
| JP | 2015-002640 A | 1/2015 |

* cited by examiner

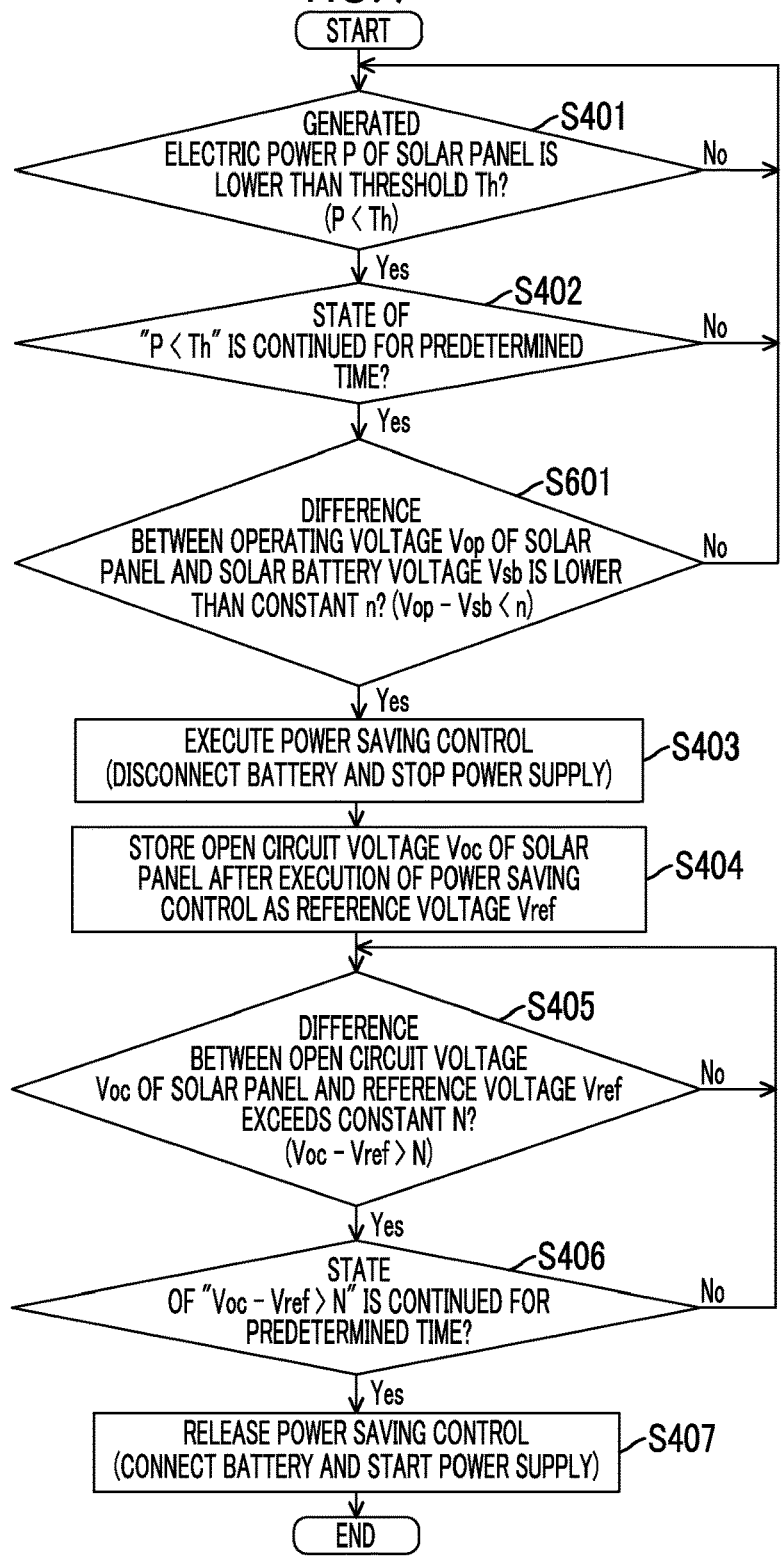

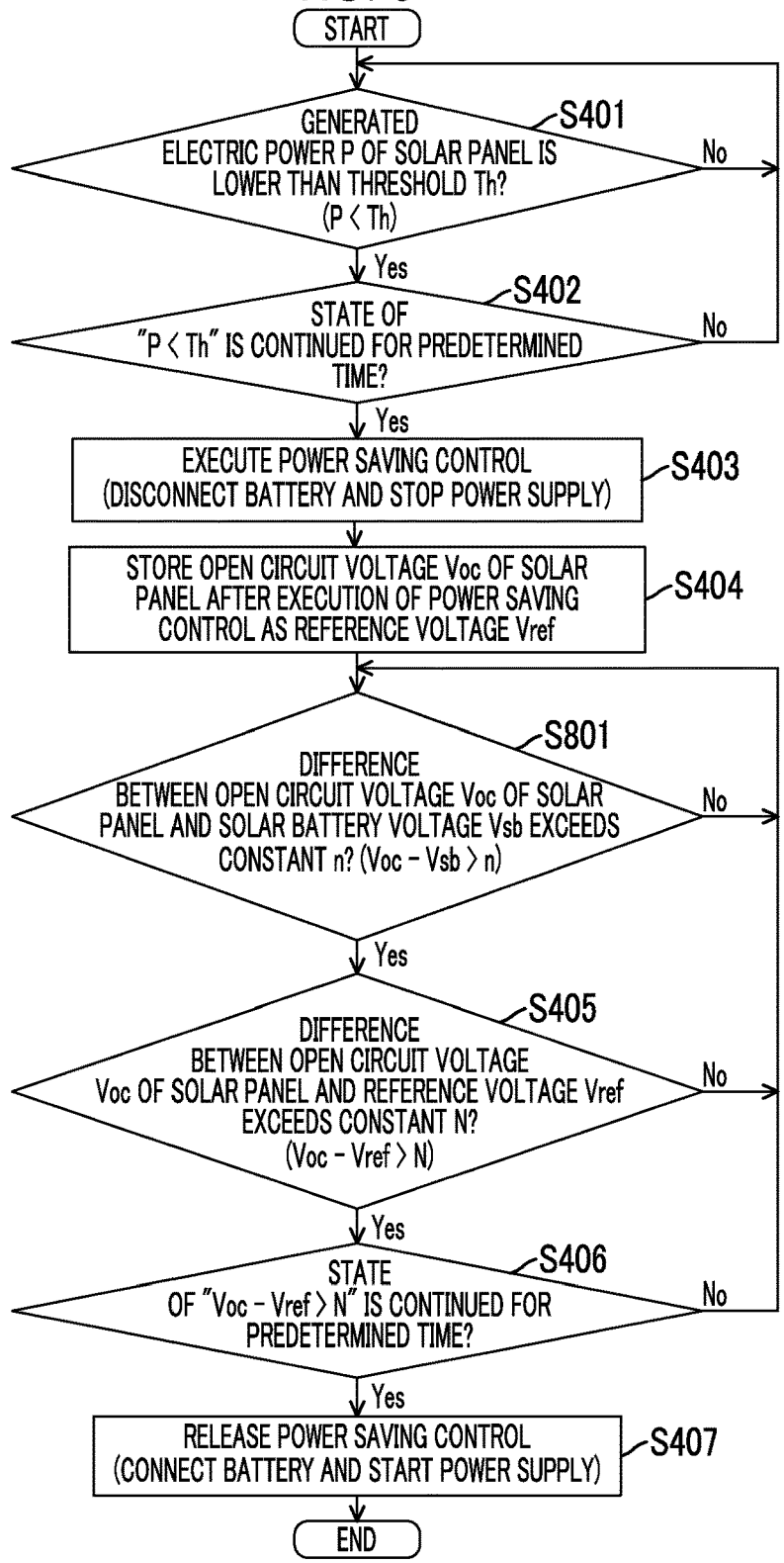

SOLAR PHOTOVOLTAIC GENERATION DEVICE

INCORPORATION BY REFERENCE

The disclosure of Japanese Patent Application No. 2016-141360 filed on Jul. 19, 2016 including the specification, drawings and abstract is incorporated herein by reference in its entirety.

BACKGROUND

1. Technical Field

The present disclosure relates to a solar photovoltaic generation device using a solar panel.

2. Description of Related Art

For example, Japanese Patent Application Publication No. 2014-217218 (JP 2014-217218 A) or Japanese Patent Application Publication No. 2015-002640 (JP 2015-002640 A) discloses a solar photovoltaic generation device configured to charge a solar battery with generated electric power output from a solar panel.

In the solar photovoltaic generation device described in these Patent Literatures, in a case where the generated electric power of the solar panel does not satisfy a predetermined value, predetermined power saving control is executed. Then, the executed power saving control is released when it is determined that a prescribed state is brought, or the like.

SUMMARY

In the solar photovoltaic generation device described in JP 2014-217218 A described above, the executed power saving control is released when a predetermined time has elapsed after the power saving control is executed, without determining the power generation condition (open circuit voltage and the like) of the solar panel.

For this reason, in the solar photovoltaic generation device described in JP 2014-217218 A, there is a possibility that the power saving control is released even if the generated electric power of the solar panel is not restored to the predetermined value when the predetermined time has elapsed, or the power saving control is not released even if the generated electric power of the solar panel is already restored to the predetermined value before the predetermined time elapses.

In the solar photovoltaic generation device described in JP 2015-002640 A, the executed power saving control is released when an open circuit voltage of the solar panel exceeds a predetermined threshold. However, the predetermined threshold is a fixed value without taking fluctuation in a current-voltage characteristic (I-V characteristic) according to a temperature environment of the solar panel into consideration.

For this reason, in the solar photovoltaic generation device described in JP 2015-002640 A, there is a possibility that the power saving control is released even if the generated electric power of the solar panel is not restored to the predetermined value when the open circuit voltage exceeds the predetermined threshold, or the power saving control is not released even if the generated electric power of the solar panel is already restored to the predetermined value before the open circuit voltage exceeds the predetermined threshold.

The disclosure has been accomplished in consideration of the above-described problems, and provides a solar photovoltaic generation device capable of suppressing a possibility that executed power saving control is released even if generated electric power of a solar panel is not restored to a predetermined value or is not released even if the generated electric power of the solar panel is restored to the predetermined value.

An aspect of the disclosure relates to a solar photovoltaic generation device using a solar panel. The solar photovoltaic generation device according to the aspect of the disclosure includes a first electric power conversion unit configured to receive generated electric power generated by the solar panel as input, convert the generated electric power to first electric power, and output the first electric power, a solar battery connected to the first electric power conversion unit and configured to be chargeable with the first electric power output from the first electric power conversion unit, a second electric power conversion unit connected to the first electric power conversion unit and the solar battery and configured to receive at least one of the first electric power output from the first electric power conversion unit or second electric power output from the solar battery as input, convert the input electric power to third electric power, and output the third electric power, and a control unit configured to control the solar battery and the first electric power conversion unit based on a state of the solar panel. In a case where it is determined that the generated electric power of the solar panel does not satisfy a predetermined value, the control unit is configured to disconnect the solar battery from the first electric power conversion unit and the second electric power conversion unit, stop power supply to the first electric power conversion unit to execute power saving control, and store, as a reference voltage, an open circuit voltage of the solar panel before a predetermined first time elapses from the execution of the power saving control. In a case where it is determined that the open circuit voltage of the solar panel exceeds the reference voltage continuously for a predetermined second time after the power saving control is executed, the control unit is configured to connect the solar battery to the first electric power conversion unit and the second electric power conversion unit, and start power supply to the first electric power conversion unit to release the power saving control.

In the above-described aspect, in a case of executing the power saving control since the generated electric power of the solar panel does not satisfy the predetermined value, the solar battery is disconnected from the first electric power conversion unit (for example, solar power converter) and the second electric power conversion unit (for example, accessory power converter), and stops power supply to the first electric power conversion unit.

With this disconnection processing, discharging of the second electric power from the solar battery to the second electric power conversion unit is inhibited. With this power supply stop processing, it is possible to bring the first electric power conversion unit into an operation stop state, and to prevent an internal circuit from performing a wasteful operation (switch operation or the like). Therefore, it is possible to reduce power consumption in the solar photovoltaic generation device.

When the power saving control is executed, the open circuit voltage (reference voltage) appearing in an output terminal of the solar panel before the predetermined first time elapses from the execution (for example, immediately after the execution) is stored. Then, the release of the power saving control being executed is determined according to whether or not the open circuit voltage appearing in the output terminal of the solar panel while the power saving control is being executed exceeds the stored reference voltage continuously for a predetermined time.

Since the stored reference voltage is a measured value of the voltage in the output terminal of the solar panel, the reference voltage includes fluctuation of the I-V characteristic according to the temperature environment of the solar panel when the power saving control is executed. Therefore, the reference voltage as a measured value, not a prescribed fixed threshold, is used for determining the release of the power saving control being executed, whereby it is possible to release the power saving control when the power generation condition of the solar panel becomes the power generation condition in the temperature environment when the power saving control is executed, that is, when the generated electric power of the solar panel corresponds to the predetermined value.

With this, it is possible to suppress a possibility that the generated electric power of the solar panel is not restored to the predetermined value when the power saving control is released. Furthermore, it is possible to suppress a possibility that the power saving control is not released even if the generated electric power of the solar panel is restored to the predetermined value.

In the above-described aspect, the control unit may be configured to determine that the generated electric power of the solar panel does not satisfy the predetermined value when the generated electric power generated by the solar panel is lower than a threshold.

In the above-described aspect, the control unit may be configured to determine that the generated electric power of the solar panel does not satisfy the predetermined value when the difference between an operating voltage of the solar panel and a terminal voltage of the solar battery becomes equal to or less than a constant.

With the determination in the second and third aspects, it is possible to reduce power consumption in the solar photovoltaic generation device.

In the above-described aspect, the control unit may have a first switch interposed between the first electric power conversion unit, the second electric power conversion unit, and the solar battery and configured to switch an electrical connection state of the solar battery to the first electric power conversion unit and the second electric power conversion unit, a second switch interposed between a power supply source configured to perform power supply to the first electric power conversion unit and the first electric power conversion unit and configured to switches an electrical connection state of the power supply source and the first electric power conversion unit, a first detection unit interposed between the solar panel and the first electric power conversion unit and configured to detect a first voltage value and a first current value in an output terminal of the solar panel, and a determination processing unit configured to control switching of the electrical connection states by the first switch and the second switch based on the first voltage value and the first current value detected by the first detection unit, and the control unit may be configured to control the solar battery and the first electric power conversion unit through the first switch, the second switch, the first detection unit, and the determination processing unit.

In the above-described aspect, the control unit may have a first switch interposed between the first electric power conversion unit, the second electric power conversion unit, and the solar battery and configured to switch an electric connection state of the solar battery to the first electric power conversion unit and the second electric power conversion unit, a second switch interposed between a power supply source configured to perform power supply to the first electric power conversion unit and the first electric power conversion unit and configured to switch an electrical connection state of the power supply source and the first electric power conversion unit, a first detection unit interposed between the solar panel and the first electric power conversion unit and configured to detect a first voltage value in an output terminal of the solar panel, a second detection unit interposed between the first switch and the solar battery and configured to detect a second voltage value in an output terminal of the solar battery, and a determination processing unit configured to control switching of the electrical connection states by the first switch and the second switch based on the first voltage value detected by the first detection unit and the second voltage value detected by the second detection unit, and the control unit may be configured to control the solar battery and the first electric power conversion unit through the first switch, the second switch, the first detection unit, the second detection unit, and the determination processing unit.

In the above-described aspect, the power saving control may be executed by turning off the first switch to disconnect the solar battery from the first electric power conversion unit and the second electric power conversion unit and turning off the second switch to stop power supply to the first electric power conversion unit.

In the above-described aspect, the power saving control may be released by turning on the first switch to connect the solar battery to the first electric power conversion unit and the second electric power conversion unit and turning on the second switch to start power supply to the first electric power conversion unit.

In the above-described aspect, the first detection unit may be configured to detect the open circuit voltage of the solar panel.

As described above, according to the solar photovoltaic generation device of the disclosure, it is possible to suppress a possibility that the executed power saving control is released even if the generated electric power of the solar panel is not restored to the predetermined value, or is not released even if the generated electric power of the solar panel is restored to the predetermined value.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 7 is a flowchart showing a processing procedure of control according to Application Example 1 which is executed by the control unit; and FIG. 8 is a flowchart showing a processing procedure of control according to Application Example 2 which is executed by the control unit.

DETAILED DESCRIPTION OF EMBODIMENTS

[Outline]

In a solar photovoltaic generation device using a solar panel according to this embodiment, in a case of executing power saving control since generated electric power of the solar panel does not satisfy a predetermined value, an open circuit voltage (=reference voltage) of the solar panel after the execution of the power saving control is stored. The release of the power saving control is determined based on the open circuit voltage of the solar panel and the stored reference voltage. Since the reference voltage includes fluctuation of an I-V characteristic according to a temperature environment of the solar panel, it is possible to suppress a possibility that the generated electric power of the solar panel when the power saving control is released is not restored corresponding to the predetermined value.

First Embodiment

<Configuration of Solar Photovoltaic Generation Device>

Figure 1:
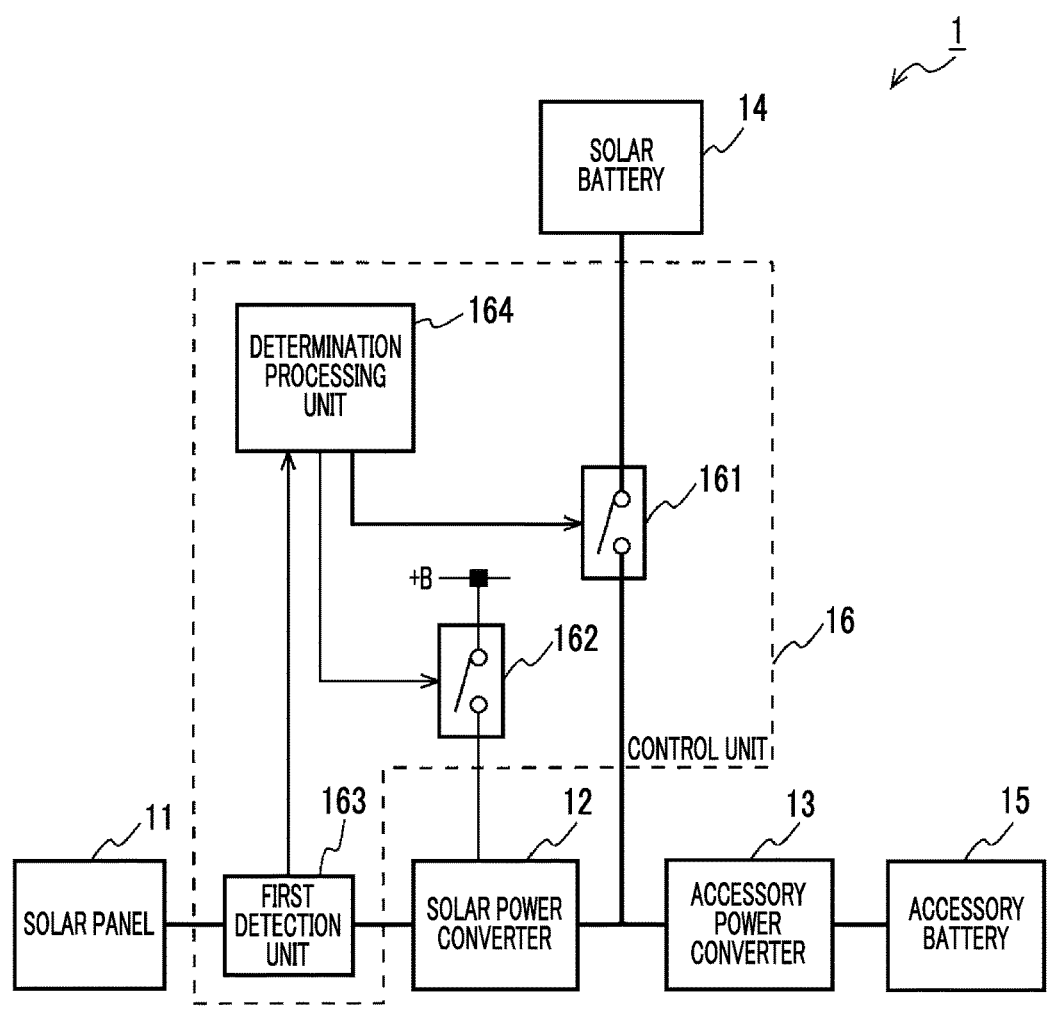
FIG. 1 is a diagram showing a configuration example of a solar photovoltaic generation device according to a first embodiment.

FIG. 1 is a diagram showing a configuration example of a solar photovoltaic generation device 1 according to a first embodiment of the disclosure. The solar photovoltaic generation device 1 according to the first embodiment illustrated in FIG. 1 includes a solar panel 11, a solar power converter 12, an accessory power converter 13, a solar battery 14, an accessory battery 15, and a control unit 16. The control unit 16 includes a first switch 161, a second switch 162, a first detection unit 163, and a determination processing unit 164.

In FIG. 1, a wiring through which an electric power (voltage and current) signal flows is indicated by a thick sold line, and a wiring through which a power supply signal or a control signal (detection value, instruction, or the like) flows is indicated by a thin solid line.

In the solar photovoltaic generation device 1, an output terminal of the solar panel 11 is connected to an input terminal of the solar power converter 12 through the first detection unit 163. An output terminal of the solar power converter 12 is connected to an input terminal of the accessory power converter 13, and is connected to the input/output terminal of the solar battery 14 through the first switch 161. An output terminal of the accessory power converter 13 is connected to an input/output terminal of the accessory battery 15. The control unit 16 is connected to the solar panel 11, the solar power converter 12, the accessory power converter 13, and the solar battery 14 through the first switch 161, the second switch 162, the first detection unit 163, and the determination processing unit 164, respectively.

Solar Panel 11

The solar panel 11 is, for example, a solar cell module which receives irradiation of sunlight and performs power generation. The solar panel 11 outputs a voltage and a current (that is, electric power) obtained by power generation to the solar power converter 12 through the first detection unit 163. A generated output of the solar panel 11 largely depends on the amount of solar radiation received by the solar panel 11 and increases when the amount of solar radiation is large.

Figure 2:
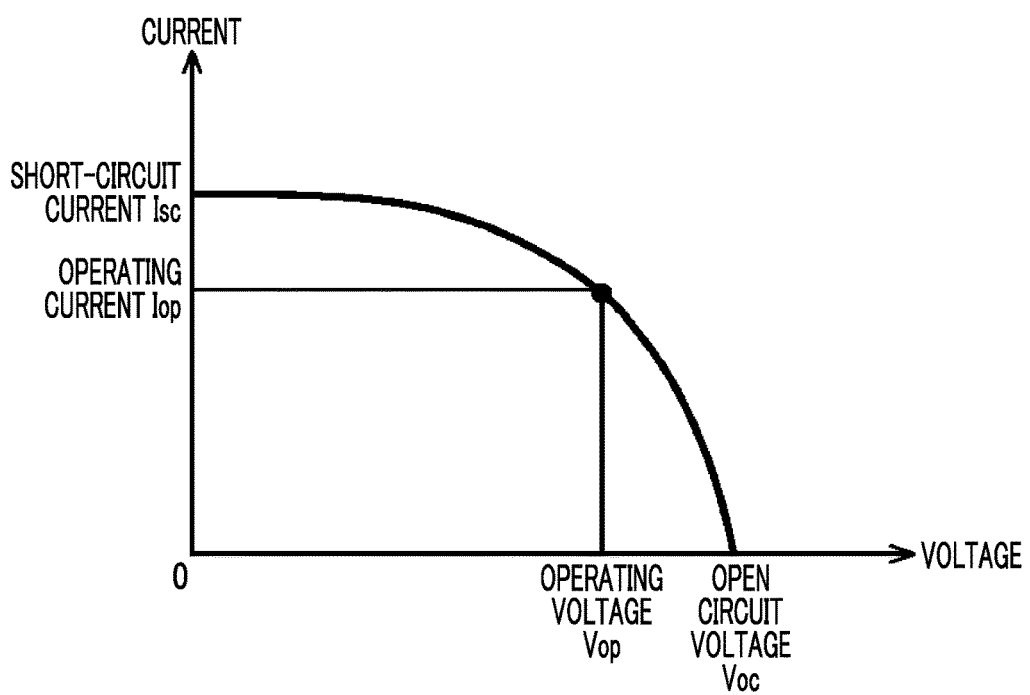
FIG. 2 is a diagram illustrating an I-V characteristic which represents power generation ability of a solar panel.

FIG. 2 illustrates an I-V characteristic which represents power generation ability of the solar panel 11. The I-V characteristic shows the correspondence relationship between a voltage (horizontal axis) and a current (vertical axis) generated by the solar panel 11 upon receiving light. An open circuit voltage Voc is a voltage value which appears in the output terminal in a state in which the output terminal of the solar panel 11 is opened with no load connected thereto, that is, in a state in which an operating current Iop is set to "0". A short-circuit current Isc is a current value which flows in the output terminal in a state where the output terminal of the solar panel 11 is short-circuited, that is, in a state in which an operating voltage Vop is set to "0".

Figure 3A:
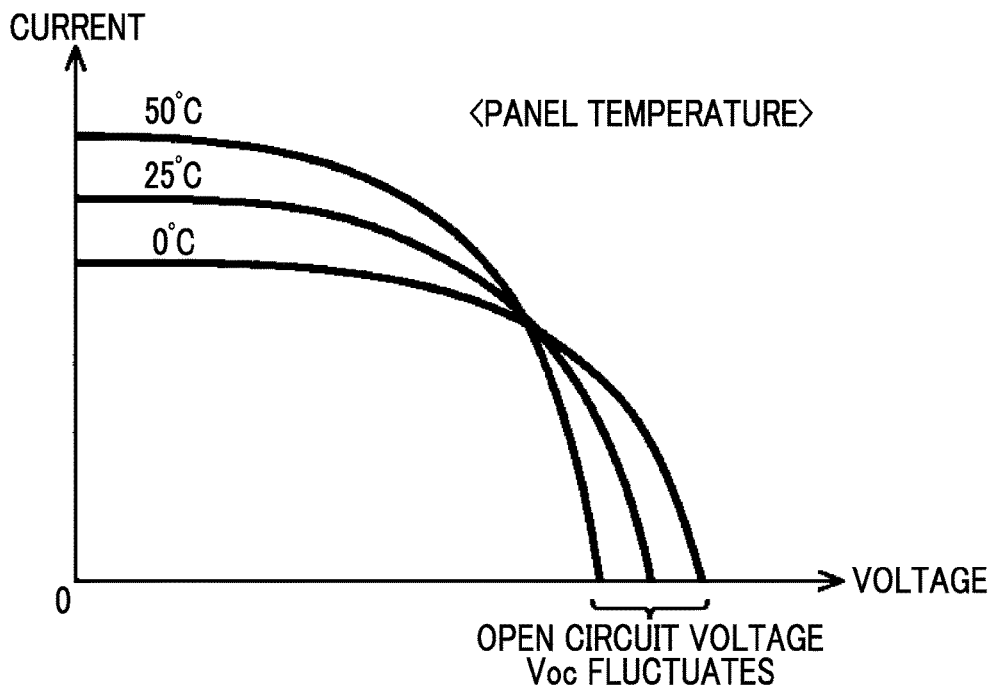
FIG. 3A is a diagram showing fluctuation of the I-V characteristic of the solar panel depending on a panel temperature.

The I-V characteristic fluctuates depending on the temperature of the solar panel 11, and the values of the open circuit voltage Voc and the short-circuit current Isc are also changed. FIG. 3A illustrates an I-V characteristic in a case where the temperature of the solar panel 11 is changed under the same irradiance. As shown in FIG. 3A, the open circuit voltage Voc of the solar panel 11 tends to decrease with an increase in the temperature (body temperature, ambient temperature) of the solar panel 11 under a condition that irradiance depending on the amount of solar radiation is constant.

Figure 3B:
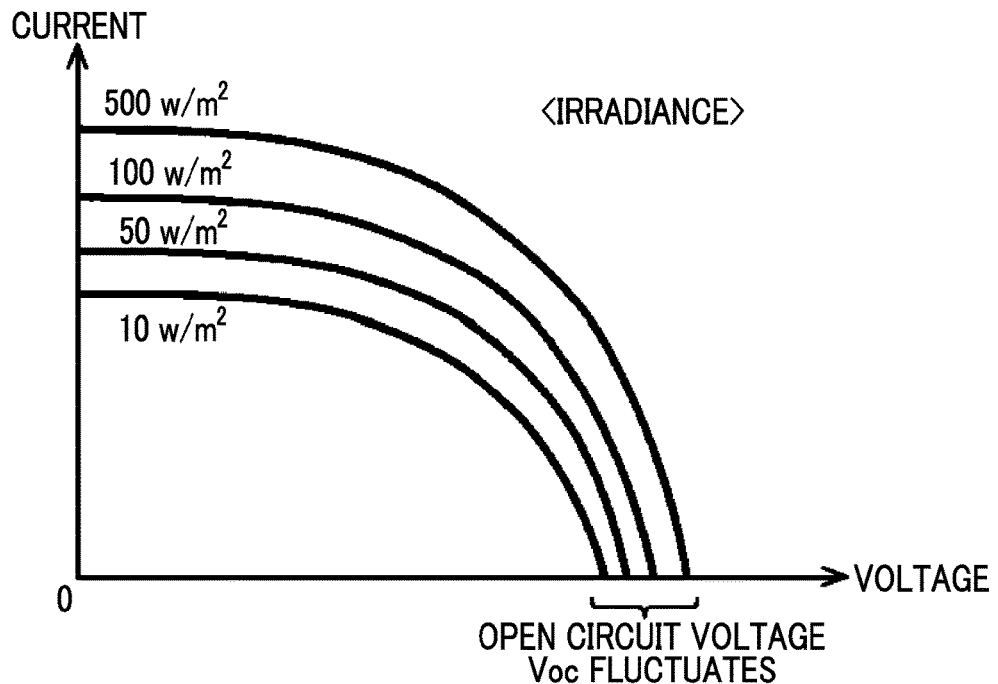
FIG. 3B is a diagram showing fluctuation of the I-V characteristic of the solar panel depending on irradiance.

The I-V characteristic fluctuates depending on the irradiance of the solar panel 11, and the values of the open circuit voltage Voc and the short-circuit current Isc are also changed. FIG. 3B illustrates an I-V characteristic in a case where the irradiance of the solar panel 11 is changed under the same temperature. As shown in FIG. 3B, the open circuit voltage Voc of the solar panel 11 tends to decrease with a decrease in the irradiance of the solar panel 11.

In this way, since the solar panel 11 has a characteristic I-V characteristic, it is possible to estimate the condition of a use environment, in which the solar panel 11 is placed, based on the open circuit voltage Voc of the solar panel 11. In this embodiment, the power saving control of the solar photovoltaic generation device 1 is appropriately performed based on the open circuit voltage Voc of the solar panel 11 focusing on the I-V characteristic of the solar panel 11.

Solar Power Converter 12

The solar power converter 12 receives the generated electric power generated by the solar panel 11 through the first detection unit 163 as input, and converts the generated electric power to predetermined first electric power. Then, the solar power converter 12 outputs the first electric power after conversion to the solar battery 14 through the first switch 161, and outputs the first electric power to the accessory power converter 13. The solar power converter 12 is constituted of, for example, a DC/DC converter, a control unit which controls the operation of the DC/DC converter, and the like (not shown). The solar power converter 12 can set an operation point of the solar panel 11, for example, using a known maximum power point tracking (MPPT) control. The solar power converter 12 corresponds to a "first electric power conversion unit" in the appended claims.

Solar Battery 14

The solar battery 14 is, for example, a chargeable/dischargeable electric power storage element, such as a nickel-hydrogen battery. The solar battery 14 is connected to the solar power converter 12 through the first switch 161 so as to be chargeable with the first electric power output from the solar power converter 12. The solar battery 14 is connected to the accessory power converter 13 through the first switch 161 so as to discharge a part of charged electric power therein as second electric power when the storage capacity of the accessory battery 15 is insufficient, or the like. Therefore, the state of charge (SOC) of the solar battery 14 becomes an integrated value of differential electric power obtained by subtracting the second electric power output to the accessory power converter 13 from the first electric power output from the solar power converter 12.

Accessory Power Converter 13

The accessory power converter 13 receives at least one of the first electric power output from the solar power converter 12 or the second electric power output from the solar battery 14 through the first switch 161 as input, and converts the input electric power to predetermined third electric power. Then, the accessory power converter 13 outputs the third electric power after conversion to the accessory battery 15. The accessory power converter 13 corresponds to a "second electric power conversion unit" in the appended claims.

Accessory Battery 15

The accessory battery 15 is, for example, a chargeable/dischargeable electric power storage element, such as a lead storage battery. The accessory battery 15 is connected to the accessory power converter 13 so as to be chargeable with the third electric power output from the accessory power converter 13. Therefore, the third electric power output from the accessory power converter 13 becomes charging electric power for charging the accessory battery 15. The accessory battery 15 is connected to an accessory load (not shown) so as to discharge electric power, and supplies electric power required for the operation of the accessory load.

Control Unit 16

The control unit 16 executes control of the solar power converter 12 and the solar battery 14 based on the state of the solar panel 11 through the first switch 161, the second switch 162, the first detection unit 163, and the determination processing unit 164 included in the configuration as follows.

The first switch 161 is interposed between the solar power converter 12 and the accessory power converter 13, and the solar battery 14, and controls a connection state of the solar power converter 12 and the accessory power converter 13 to the solar battery 14 according to an instruction from the determination processing unit 164. For the first switch 161, for example, a switch capable of switching electrical conduction/non-conduction states between two terminals according to an instruction from the outside, or the like can be used.

Specifically, in a case where an instruction for battery connection is received from the determination processing unit 164, the first switch 161 is changed to a connection state in which electrical conduction is made between the two terminals, and performs control for connecting the solar battery 14 to the solar power converter 12 and the accessory power converter 13. In the connection state, the first electric power (that is, the generated electric power generated by the solar panel 11) output from the solar power converter 12 is enabled to be charged in the solar battery 14. In the connection state, the second electric power stored in the solar battery 14 is enabled to be supplied to the accessory power converter 13 (that is, to be charged in the accessory battery 15).

In a case where an instruction for battery release is received from the determination processing unit 164, the first switch 161 is changed to an open state in which electrical non-conduction is made between the two terminals, and performs control for disconnecting and shutting off the solar battery 14 from the solar power converter 12 and the accessory power converter 13. In the open state, the first electric power (that is, the generated electric power generated by the solar panel 11) output from the solar power converter 12 is disabled to be charged in the solar battery 14. In the open state, the second electric power stored in the solar battery 14 is also disabled to be supplied to the accessory power converter 13 (that is, to be charged in the accessory battery 15).

The second switch 162 is interposed between a signal line to which a predetermined power supply voltage +B is applied and a power supply terminal (not shown) of the solar power converter 12, and controls a connection state of the power supply voltage +B and the power supply terminal of the solar power converter 12, that is, a power supply voltage supply state to the solar power converter 12 according to an instruction from the determination processing unit 164. For the second switch 162, for example, a switch capable of switching electrical conduction/non-conduction states between two terminals according to an instruction from the outside, or the like can be used.

Specifically, in a case where an instruction for power supply is received from the determination processing unit 164, the second switch 162 is changed to a connection state in which electrical conduction is made between the two terminals, and performs control for connecting the power supply terminal of the solar power converter 12 to the power supply voltage +B. In the connection state, the power supply voltage +B is supplied to a power supply circuit (not shown) of the solar power converter 12, and the solar power converter 12 is brought into an operation state.

In a case where an instruction for power non-supply is received from the determination processing unit 164, the second switch 162 is changed to an open state in which electrical non-conduction is made between the two terminals, and performs control for disconnecting and shutting off the power supply terminal of the solar power converter 12 from the power supply voltage +B. In the open state, the power supply voltage +B is not supplied to the power supply circuit (not shown) of the solar power converter 12, and the solar power converter 12 is brought into an operation stop state.

Since it should suffice that the second switch 162 can control the power supply voltage supply state to the solar power converter 12, other than using an external device, such as the switch described above, a switching element included in the power supply circuit of the solar power converter 12, or the like may be turned on/off to control the power supply voltage supply/power supply voltage shutoff states.

The first detection unit 163 is interposed between the solar panel 11 and the solar power converter 12, detects a voltage and a current appearing in the output terminal of the solar panel 11, and outputs the detected voltage and current to the determination processing unit 164. For the first detection unit 163, for example, a voltage sensor, a current sensor, or the like can be used.

Specifically, when the solar power converter 12 is operating (the second switch 162 is in the connection state and power is supplied), the first detection unit 163 detects the operating voltage Vop and the operating current Iop appearing in the output terminal of the solar panel 11.

When the solar power converter 12 is not operating (the second switch 162 is in the open state and power is not supplied), the first detection unit 163 detects the open circuit voltage Voc appearing in the output terminal of the solar panel 11.

The determination processing unit 164 acquires the operating voltage Vop, the operating current Iop, and the open circuit voltage Voc detected by the first detection unit 163 from the first detection unit 163, respectively. Then, the determination processing unit 164 performs an instruction for battery connection/battery release to the first switch 161 and an instruction for power supply/power non-supply to the second switch 162 based on the acquired voltage and current and a predetermined threshold Th or constant N set in advance, and controls the conduction/non-conduction states of the first switch 161 and the second switch 162. This control will be described below.

The solar power converter 12, the accessory power converter 13, the determination processing unit 164 of the control unit 16, and the like can be configured as an electronic control unit (ECU) typically including a central processing unit (CPU), a memory, and an input/output interface. In the electronic control unit (ECU), the CPU reads, interprets, and executes a program stored in the memory, thereby realizing a predetermined function.

<Power Saving Control which is Executed by Solar Photovoltaic Generation Device>

Figure 4:
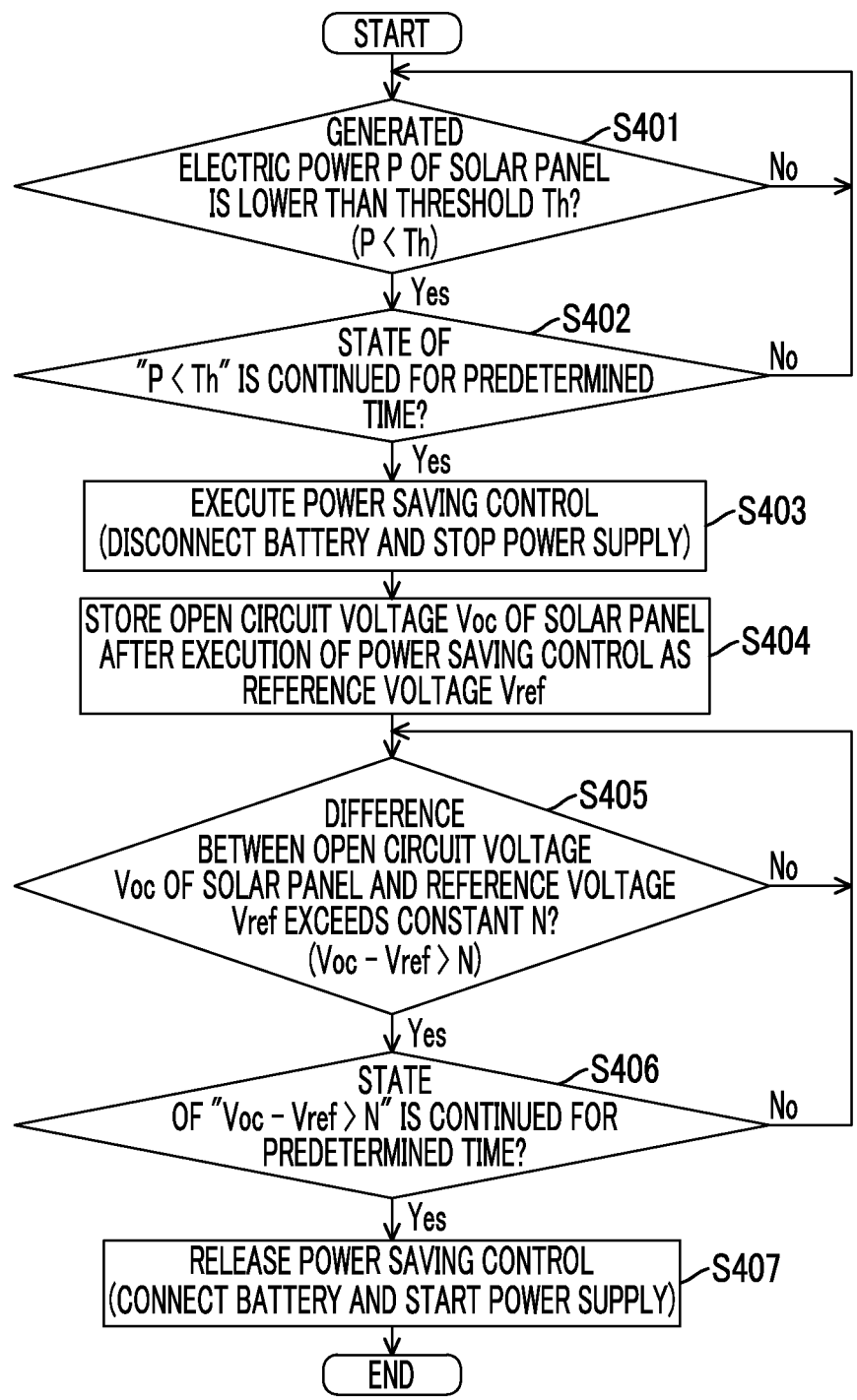
FIG. 4 is a flowchart showing a processing procedure of control which is executed by a control unit of the first embodiment.

Next, the power saving control which is executed by the solar photovoltaic generation device 1 according to the first embodiment of the disclosure will be described further referring to FIG. 4. FIG. 4 is a flowchart showing a processing procedure of control which is executed by the control unit 16 of the solar photovoltaic generation device 1.

The control shown in FIG. 4 is started if the solar photovoltaic generation device 1 operates with power supply or the like. If the solar photovoltaic generation device 1 operates, the determination processing unit 164 acquires the operating voltage Vop and the operating current Iop of the solar panel 11 detected by the first detection unit 163, and calculates the generated electric power P (=Vop×Iop) of the solar panel 11, thereby monitoring the power generation condition of the solar panel 11.

In monitoring the power generation condition of the solar panel 11 at normal time described above, the determination processing unit 164 determines whether or not the generated electric power P of the solar panel 11 is lower than the threshold Th (P<Th) (Step S401). In a case where the generated electric power P is lower than the threshold Th, the determination processing unit 164 determines whether or not this state is continued for a predetermined time (Step S402).

The threshold Th is a reference value for determining that the power generation condition of the solar panel 11 is not satisfactory and it is necessary to perform power saving control for avoiding electric power from being taken from the solar battery 14. The threshold Th is arbitrarily set based on the power generation ability of the solar panel 11, the storage capacity of the solar battery 14, or the like. The predetermine time is appropriately set in order to exclude the influence of short-term change in the generated electric power P due to instant shadow of sunlight, or the like.

In a case where it is determined that the generated electric power P of the solar panel 11 is lower than the threshold Th (Step S401: Yes), and this state is continued for the predetermined time (Step S402: Yes), that is, in a case where it is determined that the generated electric power of the solar panel 11 does not satisfy a predetermined value, the determination processing unit 164 performs a battery release instruction to the first switch 161 and a power non-supply instruction to the second switch 162, respectively, in order to execute the power saving control.

According to the above-described battery release instruction, the first switch 161 is brought into the open state, and the solar battery 14 is disconnected from the solar power converter 12 and the accessory power converter 13 (Step S403). With the disconnection processing, the second electric power can be disabled to be discharged from the solar battery 14 to the accessory battery 15. With the disconnection processing, power supply for an ECU being performed by the solar battery 14 at normal time can be stopped (for example, switching is made to power supply from the accessory battery 15). Therefore, it is possible to avoid electric power from being taken from the solar battery 14.

According to the above-described power non-supply instruction, the second switch 162 is brought into the open state, the power supply terminal of the solar power converter 12 is disconnected from the power supply voltage +B, and power supply is stopped (Step S403). With the power supply stop processing, it is possible to bring the solar power converter 12 into the operation stop state. Therefore, it is possible to avoid electric power from being wastefully consumed due to a switch operation or the like of the DC/DC converter (not shown) included in the solar power converter 12 even though the generated electric power P is not sufficiently obtained in the solar panel 11. That is, it is possible to reduce power consumption in the solar photovoltaic generation device 1.

In Step S403 described above, if the power saving control is executed by the disconnection processing of the solar battery 14 and the power supply stop processing to the solar power converter 12, the determination processing unit 164 acquires the open circuit voltage Voc appearing in the output terminal of the solar panel 11 from the first detection unit 163 before a predetermined time (corresponding to a "first time" in the appended claims) elapses from the execution of the power saving control. Then, the determination processing unit 164 stores the acquired open circuit voltage Voc as a reference voltage Vref (Step S404). The reference voltage Vref is used to determine the released of the power saving control described below.

The above-described first time may be set to a time when the open circuit voltage Voc (=reference voltage Vref) of the solar panel 11 after the execution of the power saving control does not fluctuate or undergoes less fluctuation. For example, the expression "before the predetermined first time elapses from the execution of the power saving control" is considered as immediately after the execution of the power saving control, or the like.

In Step S403 and S404 described above, after the power saving control by the disconnection of the solar battery 14 and the power supply stop of the solar power converter 12 is executed, and the reference voltage Vref is stored, the determination processing unit 164 acquires the open circuit voltage Voc of the solar panel 11 detected by the first detection unit 163 to monitor the power generation condition of the solar panel 11.

In monitoring the power generation condition at the time of power saving described above, the determination processing unit 164 determines whether or not the difference between the open circuit voltage Voc of the solar panel 11 and the stored reference voltage Vref exceeds the predetermined constant N (Voc−Vref>N) (Step S405). In a case where the voltage difference between the open circuit voltage Voc and the reference voltage Vref exceeds the constant N, the determination processing unit 164 determines whether or not this state is continued for a predetermined time (corresponding to a "second time" in the appended claims) (Step S406).

The constant N is a reference value for determining that the current power generation condition of the solar panel 11 is more satisfactory than the power generation condition before the power saving control is executed, and it is not necessary to perform the power saving control. The constant N is arbitrarily set based on the power generation ability of the solar panel 11, or the like. The predetermined time is appropriately set in order to exclude the influence of short-term change in the open circuit voltage Voc due to instant shadow of sunlight, or the like.

In a case where it is determined that the current voltage difference between the open circuit voltage Voc of the solar panel 11 and the reference voltage Vref exceeds the constant N (Step S405: Yes), and this state is continued for the predetermined time (Step S406: Yes), that is, in a case where it is determined that the generated electric power of the solar panel 11 is restored to the predetermined value, the determination processing unit 164 performs a battery connection instruction to the first switch 161 and a power supply instruction to the second switch 162, respectively, in order to release the power saving control.

According to the above-described battery connection instruction, the first switch 161 is brought into the connection state, and the solar battery 14 is connected to the solar power converter 12 and the accessory power converter 13 (Step S407). With the connection processing, the first electric power is enabled to be charged from the solar power converter 12 to the solar battery 14, and the second electric power is enabled to be discharged from the solar battery 14 to the accessory battery 15. With the connection processing, power for an ECU can be supplied from the solar battery 14.

According to the above-described power supply instruction, the second switch 162 is brought into the connection state, the power supply terminal of the solar power converter 12 is connected to the power supply voltage +B, and power supply is started (Step S407). With the power supply start processing, it is possible to start the operation of the solar power converter 12. Therefore, it is possible to store the generated electric power P generated by the solar panel 11 in the solar battery 14 through the solar power converter 12 or to supply the generated electric power P to the accessory power converter 13.

With the above, single processing from the execution of the power saving control to the release of the power saving control according to fluctuation of the generated electric power of the solar panel 11 ends. However, actually, in order to continuously determine fluctuation of the generated electric power of the solar panel 11, a series of processing of Steps S401 to S407 described above is repeatedly executed.

<Functional Effects in this Embodiment>

With the solar photovoltaic generation device 1 according to the first embodiment of the disclosure described above, determination regarding whether or not the generated electric power of the solar panel 11 does not satisfy the predetermined value to be determination of the execution of the power saving control is made according to whether or not the generated electric power P of the solar panel 11 becomes lower than the threshold Th continuously for the predetermined time. Then, in a case of executing the power saving control based on this determination, the solar battery 14 is disconnected from the solar power converter 12 and the accessory power converter 13, and power supply to the solar power converter 12 is stopped.

With the electric power converter disconnection processing, the second electric power is disabled to be discharged from the solar battery 14 to the accessory power converter 13. With the stop processing, it is possible to bring the solar power converter 12 into the operation stop state, and to prevent an internal circuit from performing a wasteful operation (switch operation or the like). Therefore, it is possible to reduce power consumption in the solar photovoltaic generation device 1.

When the power saving control is executed, the open circuit voltage (reference voltage Vref) appearing in the output terminal of the solar panel 11 before the predetermined time elapses from the execution (for example, immediately after the execution) is stored. Then, the release of the power saving control being executed is determined according to whether or not the open circuit voltage Voc appearing in the output terminal of the solar panel 11 exceeds the stored reference voltage Vref continuously for the predetermined time.

Since the stored reference voltage Vref is a measured value of an output terminal voltage of the solar panel 11, the reference voltage Vref includes fluctuation of the I-V characteristic according to the temperature environment of the solar panel 11 when the power saving control is executed. Therefore, the reference voltage Vref as a measured value, not a prescribed fixed threshold, is used for determining the release of the power saving control being executed, whereby it is possible to release the power saving control when the power generation condition of the solar panel 11 becomes the power generation condition in the temperature environment when the power saving control is executed, that is, when the generated electric power of the solar panel corresponds to the predetermined value.

With this, it is possible to suppress a possibility that the generated electric power of the solar panel 11 is not restored to the predetermined value (generated electric power P<threshold Th) when the power saving control is released. Furthermore, it is possible to suppress a possibility that the power saving control is not released even if the generated electric power of the solar panel 11 is restored to the predetermined value (generated electric power P threshold Th).

Second Embodiment

<Configuration of Solar Photovoltaic Generation Device>

Figure 5:
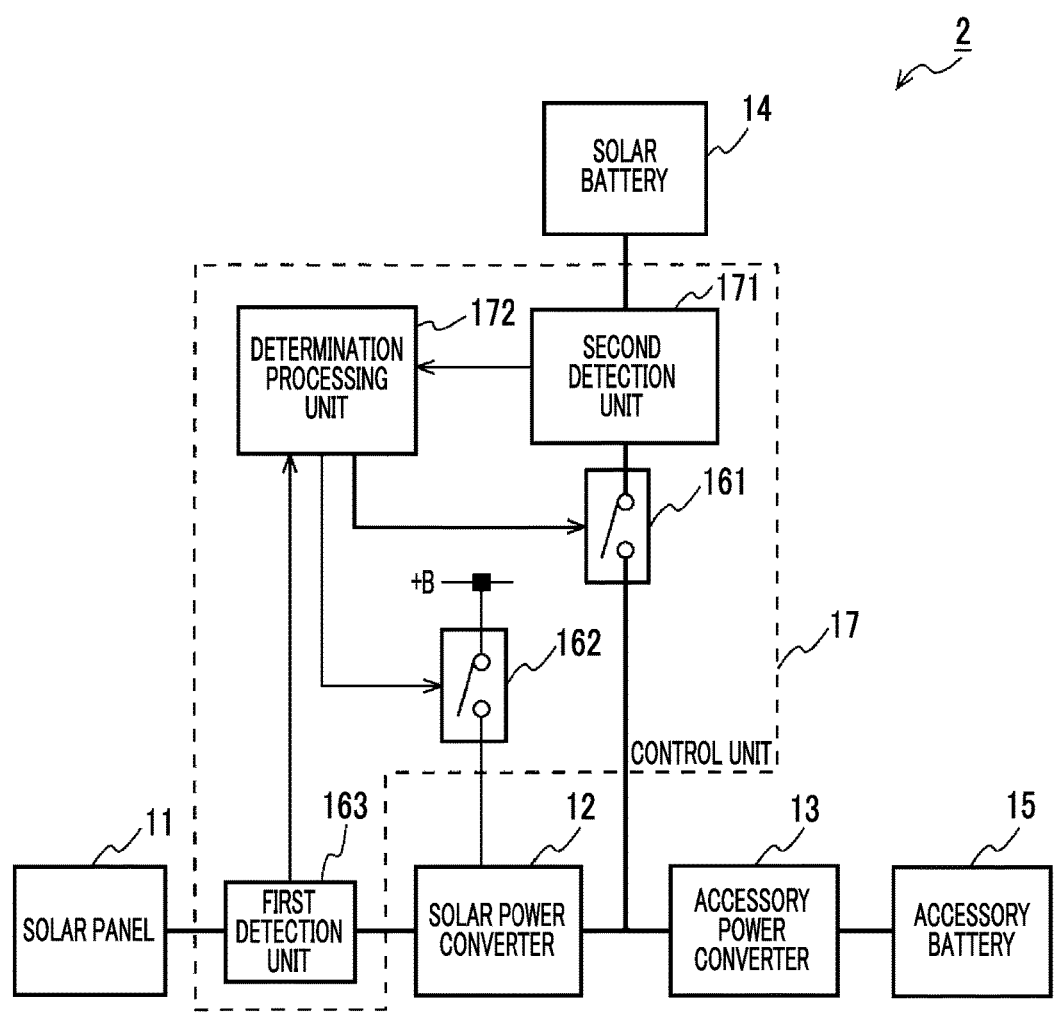
FIG. 5 is a diagram showing a configuration example of a solar photovoltaic generation device according to a second embodiment.

FIG. 5 is a diagram showing a configuration example of a solar photovoltaic generation device 2 according to a second embodiment of the disclosure. The solar photovoltaic generation device 2 according to the second embodiment illustrated in FIG. 5 includes a solar panel 11, a solar power converter 12, an accessory power converter 13, a solar battery 14, an accessory battery 15, and a control unit 17. The control unit 17 includes a first switch 161, a second switch 162, a first detection unit 163, a second detection unit 171, and a determination processing unit 172.

The configuration of the solar photovoltaic generation device 2 according to the second embodiment includes the second detection unit 171 and the determination processing unit 172 of the control unit 17 different from the solar photovoltaic generation device 1 according to the first embodiment described above. Hereinafter, the solar photovoltaic generation device 2 according to the second embodiment will be described focusing on the second detection unit 171 and the determination processing unit 172. The same configurations and control as those in the solar photovoltaic generation device 1 according to the first embodiment are represented by the same reference numerals and step numbers, and the whole or a part of description will be omitted.

In the solar photovoltaic generation device 2, an output terminal of the solar panel 11 is connected to an input terminal of the solar power converter 12 through the first detection unit 163. An output terminal of the solar power converter 12 is connected to an input terminal of the accessory power converter 13, and is connected to an input/output terminal of the solar battery 14 through the first switch 161 and the second detection unit 171. An output terminal of the accessory power converter 13 is connected to an input/output terminal of the accessory battery 15. The control unit 16 is connected to the solar panel 11, the solar power converter 12, the accessory power converter 13, and the solar battery 14 through the first switch 161, the second switch 162, the first detection unit 163, the second detection unit 171, and the determination processing unit 172, respectively.

The solar power converter 12 receives generated electric power generated by the solar panel 11 through the first detection unit 163 as input, and converts the generated electric power to predetermined first electric power. Then, the solar power converter 12 outputs the first electric power after conversion to the solar battery 14 through the first switch 161 and the second detection unit 171, and outputs the first electric power to the accessory power converter 13.

The accessory power converter 13 receives at least one of the first electric power output from the solar power converter 12 or second electric power output from the solar battery 14 through the first switch 161 and the second detection unit 171 as input, and converts the input electric power to predetermined third electric power.

The second detection unit 171 is interposed between the solar power converter 12 and the accessory power converter 13, and the solar battery 14, specifically, between the first switch 161 and the solar battery 14, detects a voltage appearing in the output terminal of the solar battery 14, and outputs the detected voltage to the determination processing unit 164. For the second detection unit 171, for example, a voltage sensor or the like can be used.

The determination processing unit 172 acquires the operating voltage Vop, the operating current Iop, and the open circuit voltage Voc detected by the first detection unit 163 from the first detection unit 163, respectively. Furthermore, the determination processing unit 172 acquires a voltage Vsb in the input/output terminal of the solar battery 14 detected by the second detection unit 171 from the second detection unit 171. Then, the determination processing unit 172 performs an instruction for battery connection/battery release to the first switch 161 and an instruction for power supply/power non-supply to the second switch 162 based on the acquired voltage and current and a predetermined constant N or constant n set in advance, and controls the conduction/non-conduction states of the first switch 161 and the second switch 162. This control will be described below.

<Power Saving Control which is Executed by Solar Photovoltaic Generation Device>

Figure 6:
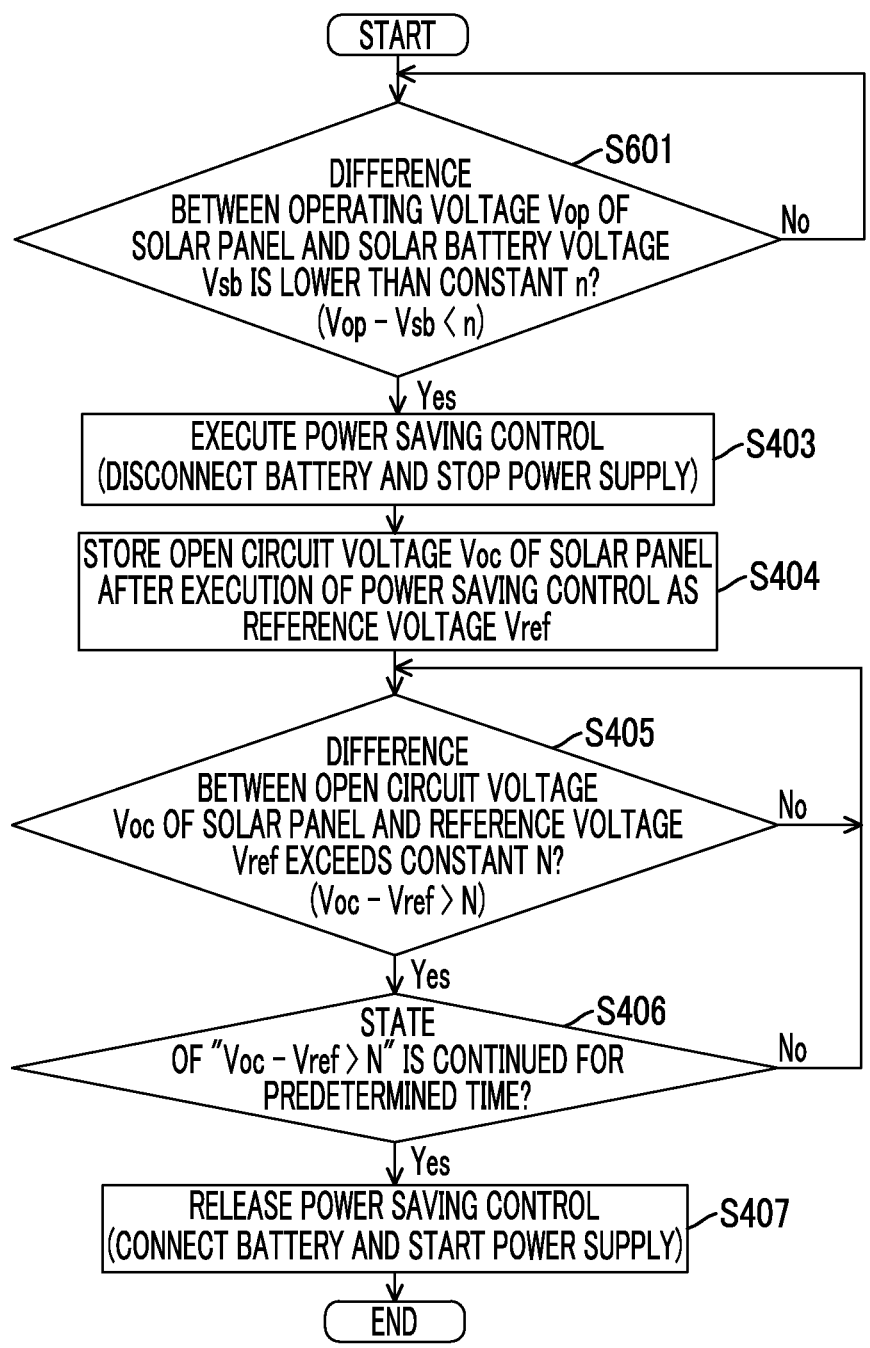
FIG. 6 is a flowchart showing a processing procedure of control which is executed by a control unit of the second embodiment.

Next, the power saving control which is executed by the solar photovoltaic generation device 2 according to the second embodiment of the disclosure will be described further referring to FIG. 6. FIG. 6 is a flowchart showing a processing procedure of control which is executed by the control unit 17 of the solar photovoltaic generation device 2. In the flowchart shown in FIG. 6, Steps S401 and S402 shown in the flowchart of FIG. 4 described above are replaced with Step S601.

If the solar photovoltaic generation device 2 operates, the determination processing unit 172 acquires the operating voltage Vop of the solar panel 11 detected by the first detection unit 163. The determination processing unit 172 acquires the voltage Vsb in the input/output terminal of the solar battery 14 detected by the second detection unit 171. Then, the determination processing unit 164 determines whether or not the difference between the operating voltage Vop of the solar panel 11 and the voltage Vsb in the input/output terminal of the solar battery 14 is lower than the constant n (Vop−Vsb<n) (Step S601).

The constant n is a reference value for determining that the power generation condition of the solar panel 11 is not satisfactory, and it is necessary to perform the power saving control for avoiding electric power from being taken from the solar battery 14. The constant n is arbitrarily set based on the power generation ability of the solar panel 11, the storage capacity of the solar battery 14, or the like.

In a case where it is determined that the difference between the operating voltage Vop of the solar panel 11 and the Vsb in the input/output terminal of the solar battery 14 is lower than the constant n (Step S601: Yes), that is, in a case where it is determined that the generated electric power of the solar panel 11 does not satisfy the predetermined value, the determination processing unit 172 performs the battery release instruction to the first switch 161 and the power non-supply instruction to the second switch 162, respectively, in order to perform the power saving control.

The subsequent processing of Steps S403 to S407 is the same as in the flowchart of FIG. 4, and will be described with the content in which the "determination processing unit 164" in the processing description relating to FIG. 4 is changed to the "determination processing unit 172".

<Functional Effects in this Embodiment>

With the solar photovoltaic generation device 2 according to the second embodiment of the disclosure described above, determination regarding whether or not the generated electric power of the solar panel 11 does not satisfy the predetermined value to be determination of the execution of the power saving control is made according to whether or not the difference between the operating voltage Vop of the solar panel 11 and the voltage Vsb in the input/output terminal of the solar battery 14 becomes lower than the constant n. Then, in a case of executing the power saving control based on this determination, the solar battery 14 is disconnected from the solar power converter 12 and the accessory power converter 13, and power supply to the solar power converter 12 is stopped.

With this processing, the solar photovoltaic generation device 2 according to the second embodiment can obtain the same functional effects as the solar photovoltaic generation device 1 according to the first embodiment described above.

Application Example 1

Application Example 1 of the power saving control which is executed by the solar photovoltaic generation device 2 according to the second embodiment described above will be described. FIG. 7 is a flowchart showing a processing procedure of control according to Application Example 1 which is executed by the control unit 17 of the solar photovoltaic generation device 2.

In the flowchart shown in FIG. 7, Step S601 described above is added between Steps S402 and S403 shown in the flowchart of FIG. 4 described above. That is, in this control, the control of the first embodiment and the control of the second embodiment are combined.

As shown in FIG. 7, control can be adopted in which the power saving control can be executed in a case where it is determined that the generated electric power P of the solar panel 11 is lower than the threshold Th (Step S401: Yes), and this state is continued for the predetermined time (Step S402: Yes), and in addition, in a case where it can be determined that the difference between the operating voltage Vop of the solar panel 11 and the voltage Vsb in the input/output terminal of the solar battery 14 is lower than the constant n (Step S601: Yes).

Application Example 2

Application Example 2 of the power saving control which is executed by the solar photovoltaic generation device 2 according to the second embodiment described above will be described. FIG. 8 is a flowchart showing a processing procedure of control according to Application Example 2 which is executed by the control unit 17 of the solar photovoltaic generation device 2.

In the flowchart shown in FIG. 8, new Step S801 is added between Steps S404 and S405 shown in the flowchart of FIG. 4 described above. In Step S801, during the execution of the power saving control, the open circuit voltage Voc of the solar panel 11 is acquired from the first detection unit 163, and the voltage Vsb in the input/output terminal of the solar battery 14 is acquired from the second detection unit 171, respectively. Then, control can be adopted in which the process can progress to the determination of Step S405 in a case where it can be determined that the difference between the open circuit voltage Voc and the terminal voltage Vsb is higher than the constant n (Voc−Vsb>n).

According to Application Example 2, even in a case where rapid change in temperature occurs after the power saving control starts, it is possible to suppress a possibility that the generated electric power of the solar panel 11 is not restored corresponding to the predetermined value when the power saving control is released.

Although the disclosure has been described above in detail, the foregoing description is illustrative in all aspects and not restrictive. It is understood that various improvements or modifications can be made without departing from the spirit of the disclosure.

The solar photovoltaic generation device of the disclosure is available in a power supply system, such as a vehicle, in which electric power generated by a solar panel should be used.

What is claimed is:

1. A solar photovoltaic generation device using a solar panel, the solar photovoltaic generation device comprising:
    a first electric power conversion unit configured to receive generated electric power generated by the solar panel as an input, convert the generated electric power to a first electric power, and output the first electric power;
    a solar battery connected to the first electric power conversion unit and configured to be chargeable with the first electric power output from the first electric power conversion unit;
    a second electric power conversion unit connected to the first electric power conversion unit and the solar battery, and configured to receive at least one of the first electric power output from the first electric power conversion unit or a second electric power output from the solar battery as an input electric power, convert the input electric power to a third electric power, and output the third electric power; and
    a control unit configured to control the solar battery and the first electric power conversion unit based on a state of the solar panel,
    wherein, in a case where it is determined that the generated electric power of the solar panel does not satisfy a predetermined value, the control unit is configured to disconnect the solar battery from the first electric power conversion unit and the second electric power conversion unit, stop providing a power supply to the first electric power conversion unit to execute a power saving control, and store, as a reference voltage, an open circuit voltage of the solar panel before a predetermined first time period elapses from the execution of the power saving control, and in a case where it is determined that the open circuit voltage of the solar panel exceeds the reference voltage continuously for a predetermined second time period after the power saving control is executed, the control unit is configured to connect the solar battery to the first electric power conversion unit and the second electric power conversion unit, and start providing the power supply to the first electric power conversion unit to release the power saving control.

2. The solar photovoltaic generation device according to claim 1,
    wherein the control unit is configured to determine that the generated electric power of the solar panel does not satisfy the predetermined value when the generated electric power generated by the solar panel is lower than a threshold.

3. The solar photovoltaic generation device according to claim 1,
    wherein the control unit is configured to determine that the generated electric power of the solar panel does not satisfy the predetermined value when a difference between an operating voltage of the solar panel and a terminal voltage of the solar battery becomes equal to or less than a constant.

4. The solar photovoltaic generation device according to claim 1,
    wherein the control unit has a first switch interposed between the first electric power conversion unit, the second electric power conversion unit, and the solar battery and configured to switch an electrical connection state of the solar battery to the first electric power conversion unit and the second electric power conversion unit, a second switch interposed between a power supply source configured to perform power supply to the first electric power conversion unit and the first electric power conversion unit and configured to switches an electrical connection state of the power supply source and the first electric power conversion unit, a first detection unit interposed between the solar panel and the first electric power conversion unit and configured to detect a first voltage value and a first current value at an output terminal of the solar panel, and a determination processing unit configured to control switching of the electrical connection states by the first switch and the second switch based on the first voltage value and the first current value detected by the first detection unit, and the control unit is configured to control the solar battery and the first electric power conversion unit through the first switch, the second switch, the first detection unit, and the determination processing unit.

5. The solar photovoltaic generation device according to claim 1,
    wherein the control unit has a first switch interposed between the first electric power conversion unit, the second electric power conversion unit, and the solar battery and configured to switch an electric connection state of the solar battery to the first electric power conversion unit and the second electric power conversion unit, a second switch interposed between a power supply source configured to perform power supply to the first electric power conversion unit and the first electric power conversion unit and configured to switch an electrical connection state of the power supply source and the first electric power conversion unit, a first detection unit interposed between the solar panel and the first electric power conversion unit and configured to detect a first voltage value at an output terminal of the solar panel, a second detection unit interposed between the first switch and the solar battery and configured to detect a second voltage value at an output terminal of the solar battery, and a determination processing unit configured to control switching of the electrical connection states by the first switch and the second switch based on the first voltage value detected by the first detection unit and the second voltage value detected by the second detection unit, and the control unit is configured to control the solar battery and the first electric power conversion unit through the first switch, the second switch, the first detection unit, the second detection unit, and the determination processing unit.

6. The solar photovoltaic generation device according to claim 4,
wherein the power saving control is executed by turning off the first switch to disconnect the solar battery from the first electric power conversion unit and the second electric power conversion unit and turning off the second switch to stop providing the power supply to the first electric power conversion unit.

7. The solar photovoltaic generation device according to claim 6,
wherein the power saving control is released by turning on the first switch to connect the solar battery to the first electric power conversion unit and the second electric power conversion unit and turning on the second switch to start providing the power supply to the first electric power conversion unit.

8. The solar photovoltaic generation device according to claim 4,
wherein the first detection unit is configured to detect the open circuit voltage of the solar panel.

* * * * *